United States Patent
Lu et al.

(10) Patent No.: US 12,090,590 B1
(45) Date of Patent: Sep. 17, 2024

(54) SIX-DEGREE-OF-FREEDOM AIR-FLOATING MOVING APPARATUS

(71) Applicant: WUXI XIVI SCIENCE AND TECHNOLOGY CO., LTD., Wuxi (CN)

(72) Inventors: Minjie Lu, Wuxi (CN); Yanyan Jiang, Wuxi (CN)

(73) Assignee: WUXI XIVI SCIENCE AND TECHNOLOGY CO., LTD., Wuxi (CN)

( * ) Notice: Subject to any disclaimer, the term of this patent is extended or adjusted under 35 U.S.C. 154(b) by 0 days.

(21) Appl. No.: 18/655,355

(22) Filed: May 6, 2024

Related U.S. Application Data

(63) Continuation of application No. PCT/CN2024/079805, filed on Mar. 4, 2024.

(30) Foreign Application Priority Data

Oct. 10, 2023 (CN) .......................... 202311302476.6

(51) Int. Cl.
| | | |
|---|---|---|
| B23Q 1/62 | (2006.01) | |
| F16C 29/02 | (2006.01) | |
| G03F 7/00 | (2006.01) | |
| H01L 21/68 | (2006.01) | |

(52) U.S. Cl.
CPC ............ B23Q 1/623 (2013.01); *F16C 29/025* (2013.01); *G03F 7/70716* (2013.01); *H01L 21/68* (2013.01)

(58) Field of Classification Search
CPC . B23Q 1/015; B23Q 1/36; B23Q 1/38; B23Q 1/62–625; B23Q 11/0032; B23Q 3/152; B23Q 7/02
See application file for complete search history.

(56) References Cited

U.S. PATENT DOCUMENTS

| | | |
|---|---|---|
| 2012/0064460 A1 | 3/2012 | Aoki |
| 2019/0094696 A1 | 3/2019 | Ding |
| 2020/0164463 A1 | 5/2020 | Shibazaki |

FOREIGN PATENT DOCUMENTS

| | | | |
|---|---|---|---|
| CN | 101221366 A | | 7/2008 |
| CN | 101533226 A | * | 9/2009 |
| CN | 102537049 A | * | 7/2012 |
| CN | 103791018 A | | 5/2014 |

* cited by examiner

*Primary Examiner* — Tyrone V Hall, Jr.

(74) *Attorney, Agent, or Firm* — True Shepherd LLC; Andrew C. Cheng

(57) ABSTRACT

A six-degree-of-freedom air-floating moving apparatus comprises a base platform, a floating platform is provided above the base platform, a micromotion platform is provided above the floating platform, the base platform is provided with an X-axis moving assembly, the floating platform is provided with a Y-axis moving assembly, the X-axis moving assembly drives the floating platform to move, the Y-axis moving assembly drives the micromotion platform to move, a damping assembly for reducing shaking is connected to a bottom of the micromotion platform, the X-axis moving assembly comprises an X-axis linear motor and an X-axis bearing platform, the X-axis linear motor is connected to each of two sides of the floating platform, the X-axis bearing platform is provided at each of two sides below the floating platform, an air bearing is provided at a bottom of the floating platform, and the air bearing is matched with the X-axis bearing platform.

4 Claims, 8 Drawing Sheets

SIX-DEGREE-OF-FREEDOM AIR-FLOATING MOVING APPARATUS

CROSS-REFERENCE TO RELATED APPLICATIONS

This application is a continuation of International Patent Application No. PCT/CN2024/079805 with a filing date of Mar. 4, 2024, designating the United States, now pending, and further claims priority to Chinese Patent Application No. 202311302476.6 with a filing date of Oct. 10, 2023. The content of the aforementioned applications, including any intervening amendments thereto, are incorporated herein by reference.

TECHNICAL FIELD

The present disclosure relates to the technical field of air-floating linear platforms, and in particular to a six-degree-of-freedom air-floating moving apparatus.

BACKGROUND ART

High precision positioning platforms are widely applied in the fields of semiconductor manufacturing, precision machining, etc. By taking projection lithography equipment as an example, with the development of technology, the requirements for the production efficiency are getting higher, the substrate size is getting bigger, the thickness is changing greatly, and the stroke of the positioning platform bearing the substrate is also getting bigger. In the fields of semiconductor manufacturing, precision machining, image alignment, etc., various types of precision positioning platforms are often used, for example, a wafer stage, a reticle stage, etc. in a lithography machine. In order to achieve ultra-precision positioning requirements, an execution unit which takes air-floating and magnetic levitation constraints as a support method is widely applied as an ultra-precision movement platform. When the air-floating constraint serves as support and guide, a frictional force, etc. caused by transmission of a mechanical structure is reduced, and the movement positioning precision of a system is improved. When a linear motor is taken as a driving unit, the Lorentz force generated by an energized coil in an air-gap magnetic field of a permanent magnet array provides a driving force, and a thrust force of the execution unit is changed by controlling a current magnitude in the coil, which has the advantages of simple structure, etc.

At present, the reticle stage in the lithography machine usually uses a structure of coarse motion and micromotion laminations, and comprises two coarse motion platforms moving along a Y-axis direction and one six-degree-of-freedom micromotion platform. The two coarse motion platforms are connected together by a connection beam, wherein the connection beam is fixedly connected with one coarse motion platform and connected with the coarse motion platform at the other side through a flexible hinge, and the micromotion platform is installed on the connection beam, to achieve overall movement of a positioning device. On one hand, the platform has a complex structure, which increases structural mass of a system and easily affects motion response performance of the system. On the other hand, a positional deviation of the two coarse motion platforms will cause the performance of the two coarse motion platforms to affect each other, which will affect the motion positioning accuracy of the system.

A US patent with application number of U.S. Pat. No. 17/668,425 discloses a high precision air-floating motion platform and a method for wafer testing, wherein the air-floating motion platform comprises: a substrate; a beam installed on a base; a sliding platform loading a wafer; a linear motor, which is configured to drive the sliding platform to slide along the beam; at least three sensors, which are configured to detect vertical straightness of the wafer; an air bearing, which comprises a first air bearing, a second air bearing and a third air bearing, and is configured to suspend the sliding platform; and a compensation device, which is configured to compensate the vertical straightness of the wafer based on real-time data detected by the sensors. The patent reduces motion interference caused by a platform deviation, but has room for improvement in the following technical levels: the platform reciprocates, and an external airflow is easy to affect a degree of uniformity of an air film of the air bearing, which is not beneficial for slipping stability; and the platform can only slip in a uniaxial direction, which is unable to achieve precision control motion of coordinates in space.

SUMMARY OF THE PRESENT INVENTION

An object of the present disclosure is to provide a six-degree-of-freedom air-floating moving apparatus which has motion stability and precision and can prevent motion interference.

To achieve the above object, the following technical solution is adopted in the present disclosure:

a six-degree-of-freedom air-floating moving apparatus, comprising a base platform, wherein a floating platform is provided above the base platform, a micromotion platform is provided above the floating platform, the base platform is provided with an X-axis moving assembly, the floating platform is provided with a Y-axis moving assembly, the X-axis moving assembly can drive the floating platform to move, the Y-axis moving assembly can drive the micromotion platform to move, and a damping assembly is connected to a bottom of the micromotion platform. The floating platform is controlled by the X-axis moving assembly provided on the base platform, so that the floating platform moves linearly on an X-axis with respect to the base platform, and the micromotion platform is controlled by the Y-axis moving assembly connected with the floating platform, so that the micromotion platform moves linearly in a Y-axis direction with respect to the floating platform. The micromotion platform itself can achieve axial rotation in the X-axis or Y-axis direction, to adjust an angle position, and the micromotion platform itself has a liftable and lowerable rotation platform, to achieve lifting up and down and axial rotation in a Z-axis direction and match the X-axis moving assembly and the Y-axis moving assembly to achieve six-degree-of-freedom motion. The overall structure is compact, and the occupied space is small.

Preferably, the X-axis moving assembly comprises an X-axis linear motor and an X-axis bearing platform, the X-axis linear motor is connected to each of two sides of the floating platform, the X-axis bearing platform is provided at each of two sides below the floating platform, an air bearing is provided at a bottom of the floating platform, and the air bearing is matched with the X-axis bearing platform. The X-axis linear motor is used for controlling and driving the floating platform to move, and the air bearing can form an air film at an upper end of the X-axis bearing platform after ventilation to form an air-floating support at the bottom of the floating platform.

Preferably, the Y-axis moving assembly comprises a Y-axis linear motor and a sliding platform, the Y-axis linear motor is fixed below the floating platform, the sliding platform is provided on the floating platform and connected with the Y-axis linear motor, and the micromotion platform is provided above the sliding platform through the damping assembly.

Preferably, the damping assembly comprises a bottom plate fixed at an upper end of the sliding platform, a first damping member supporting the micromotion platform is provided in the center of the bottom plate, a plurality of second damping members around the first damping member are provided on the bottom plate, a first connection pipe is provided between the first damping member and any of the second damping members, and a second connection pipe is provided between the adjacent second damping members. The first damping member in the center of the bottom plate provides central support for the micromotion platform, the micromotion platform shakes in a motion process or at the moment when the motion stops, the shaking is transferred to the first damping member below, and the first damping member disperses the interference generated by the shaking to the plurality of second damping members dispersed annularly through the first connection pipe, which reduces vibration interference in the internal center of the micromotion platform. On one hand, the motion precision is improved, and the interference during slipping motion caused by an assembly deviation due to the vibration is prevented. On the other hand, it is beneficial for protecting an internal structure of the micromotion platform and reducing the maintenance cost.

Preferably, the first damping member comprises a base fixed to the bottom plate, a sleeve is fixed in the base, a piston is slidably connected in the sleeve, a rubber joint is connected to an upper part of the piston, the rubber joint supports a bottom of the micromotion platform, a cylindrical spring is connected between the rubber joint and the piston, a plurality of air holes are provided in a side wall of the sleeve, and a plurality of vertical joints are provided on a side wall of the base. The micromotion platform presses the rubber joint while shaking, the rubber joint drives the piston connected below to lift up and down with respect to the sleeve, the cylindrical spring resets after compressed deformation, the piston moves down in the sleeve and squeezes an internal gas, and the gas can be slowly discharged from the air holes annularly arranged in the side wall of the sleeve into the base and slowly discharged from the plurality of vertical joints, to buffer jumping of the micromotion platform in the Z-axis direction, thereby further improving the precision. The operation space of the micromotion platform is usually a dustfree environment, but the possibility of impurities and debris on a surface of the floating platform is not excluded. The airflow discharged from the plurality of vertical joints can flow to the outside. On one hand, the flow of the airflow around the bottom of the micromotion platform is facilitated, which is beneficial for cleaning the impurities on the floating platform and achieving self-cleaning. On the other hand, the flowing airflow can cool the micromotion platform upwards, to optimize a working environment of the micromotion platform and increase the service life. The sleeve and the piston are provided to form an interval between the micromotion platform and the floating platform, to prevent the air film formed by the air bearing from affecting the stability of parts above the micromotion platform.

Preferably, the bottom plate is a square plate, the second damping member comprises a cylindrical air bag, a plurality of the cylindrical air bags are located at four corners of the bottom plate, respectively, the cylindrical air bag is communicated with an interior of the base through the first connection pipe, and the adjacent cylindrical air bags are communicated through the second connection pipe. A part of the airflow discharged from the air holes of the sleeve can pass through the first connection pipe to enter each cylindrical air bag, and the air bag is inflated to form a support for four corners of the micromotion platform, to ensure parallelism between the micromotion platform and the floating platform and prevent reduced precision caused by tilted installation of the parts on the micromotion platform. In addition, when the working intensity of the micromotion platform is too high, which causes an excessively higher local temperature, heat is transferred to the cylindrical air bag, so that its internal gas absorbs the heat and expands, and the adjacent cylindrical air bags disperse the heated gas through the second connection pipe, to prevent faults caused by local overheating of the micromotion platform. In addition, since the cylindrical air bag is limited by the micromotion platform above and the bottom plate below, a degree of expansion of the cylindrical air bag is limited, so that the gas acts to the base and is discharged from the sleeve, to achieve heat dissipation.

Preferably, the air bearing comprises a matrix, a cylindrical groove is located at a bottom of the matrix, a porous plate is provided in the cylindrical groove, a cavity is formed between an inner wall of the cylindrical groove and an outer wall of the porous plate, the cavity is communicated with an air vent, a flow rectifier plate is provided in the cavity, the flow rectifier plate has a U-shaped cross section and an upward opening, and a filter mesh is provided in the center of the flow rectifier plate. The gas entering the air vent is subjected to primary filtration by external filtration equipment and then enters the cavity. In order to ensure that the gas passing through the porous plate does not contain fine particles or water, the filter mesh with higher entrapment precision than that of the external filtration equipment is provided to perform secondary filtration on the gas, to prevent impurities and particulate matters in the gas from blocking the porous plate and ensure the stability of forming the air film by the porous plate. The other part of the airflow is guided by an arc-shaped curved surface after being in contact with the flow rectifier plate, the impurities and particulate matters filtered on the filter mesh can be guided, and the particulate matters are facilitated to fall into a concave space of the flow rectifier plate. On one hand, the particulate matters are collected; on the other hand, the particulate matters are avoided to continuously stay on the filter mesh to cause the inability of subsequent gases to pass smoothly, resulting in the instability of forming the air film by the porous plate.

Preferably, a guide ring is provided at the bottom of the matrix, the guide ring is sheathed outside the porous plate, a guide groove is provided inside the guide ring, the guide groove is an arc-shaped groove, and a plurality of the guide grooves are arranged annularly. Without ventilation or in case of unstable airflow output, a bottom end surface of the guide ring is in contact with the X-axis bearing platform, to reduce the abrasion possibility of the porous plate, ensure stable output of the air film and increase the service life to reduce the maintenance cost. The guide ring guides the gas discharged from the porous plate to flow around quickly through the guide groove inside the guide ring, to form spiral airflow, which can prevent the airflow from gathering in front of the porous plate to cause gas block-up, and is beneficial for preventing unsmooth air-exhaust from causing an offset of the floating platform.

Since the damping assembly capable of reducing swaying interference and capable of self-heat dissipation is used to support the micromotion platform, the present disclosure has the following beneficial effects: when the micromotion platform sways, the piston squeezes the gas in the sleeve to consume the gas, which is beneficial for improving the motion precision; the piston moves and squeezes the gas to be slowly discharged from the air holes, which is conducive to sweeping up dust, preventing lagging and cooling the micromotion platform; the air bags of the bottom plate provided at various corners are communicated with each other, which can support the micromotion platform, and are communicated through the second connection pipe, to cool the micromotion platform and prevent local overheating from causing faults of the micromotion platform; the flow rectifier plate and the filter mesh are provided in an airflow input direction of the porous plate, to filter the input airflow to prevent blocking the porous plate, and meanwhile the flow rectifier plate guides the forward airflow, to sweep up and collect particulate impurities on the filter mesh and prevent the blocking of the filter mesh from resulting in the instability of forming the air film by the porous plate; the guide ring forms spiral airflow on the air film output by the porous plate and diffuses the airflow, to prevent the airflow from centralized output resulting in gas block-up and offset; a bottom end of the guide ring is lower than a bottom end of the porous plate, and is in contact with the X-axis bearing platform in case of gas interruption or insufficient gas supply, to prevent abrasion of the porous plate. Therefore, the prevent disclosure is a six-degree-of-freedom air-floating moving apparatus which has motion stability and precision and can prevent motion interference.

Figure 1:
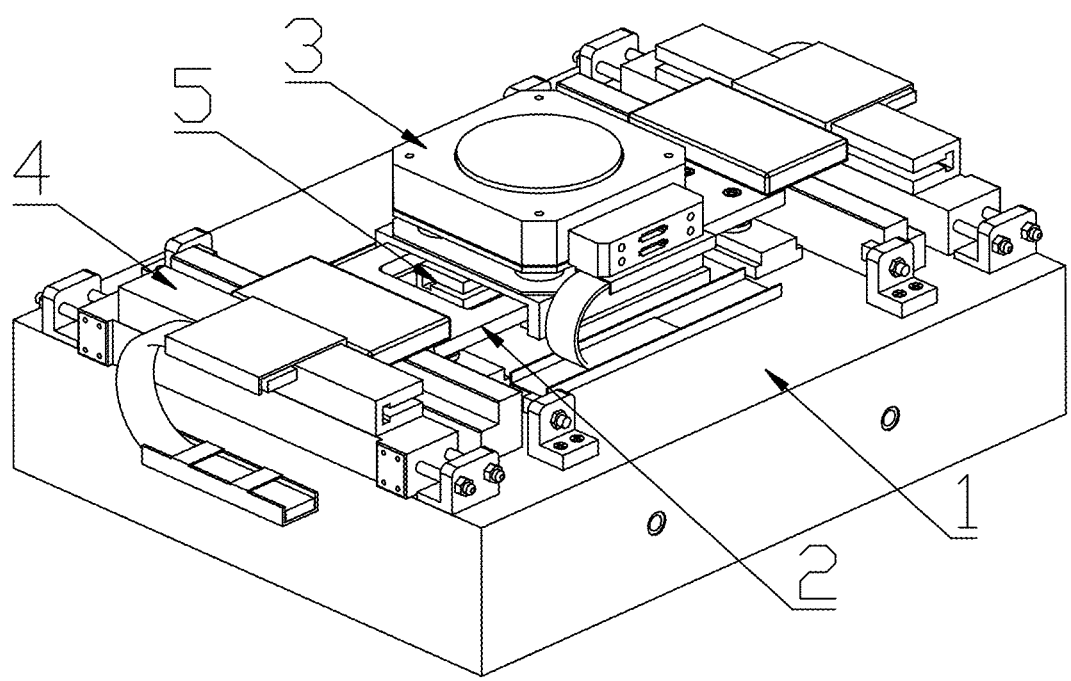
FIG. 1 is a schematic diagram for installing a floating platform on a base platform.

Reference signs in the drawings: base platform 1; floating platform 2; micromotion platform 3; X-axis moving assembly 4; X-axis linear motor 40; X-axis bearing platform 41; Y-axis moving assembly 5; Y-axis linear motor 50; sliding platform 51; damping assembly 6; bottom plate 60; first damping member 61; second damping member 62; first connection pipe 63; second connection pipe 64; base 610; sleeve 611; piston 612; rubber joint 613; cylindrical spring 614; air hole 615; vertical joint 616; air bag 620; air bearing 7; matrix 70; porous plate 71; air vent 72; flow rectifier plate 73; filter mesh 74; guide ring 8; guide groove 80; auxiliary assembly 9; guard ring 90; trough 91; pipe sleeve 92; silicon valve 93; support ring 94; reset spring 95; guide column 96.

DESCRIPTION OF EMBODIMENTS

The technical solution of the present disclosure is described in further detail below in combination with specific embodiments and the drawings. Obviously, the described embodiments are only a part of embodiments of the present disclosure, not all embodiments. On the basis of the embodiments in the present disclosure, all other embodiments obtained by those of ordinary skill in the art without creative labor fall into the protection scope of the present disclosure.

Figure 2:
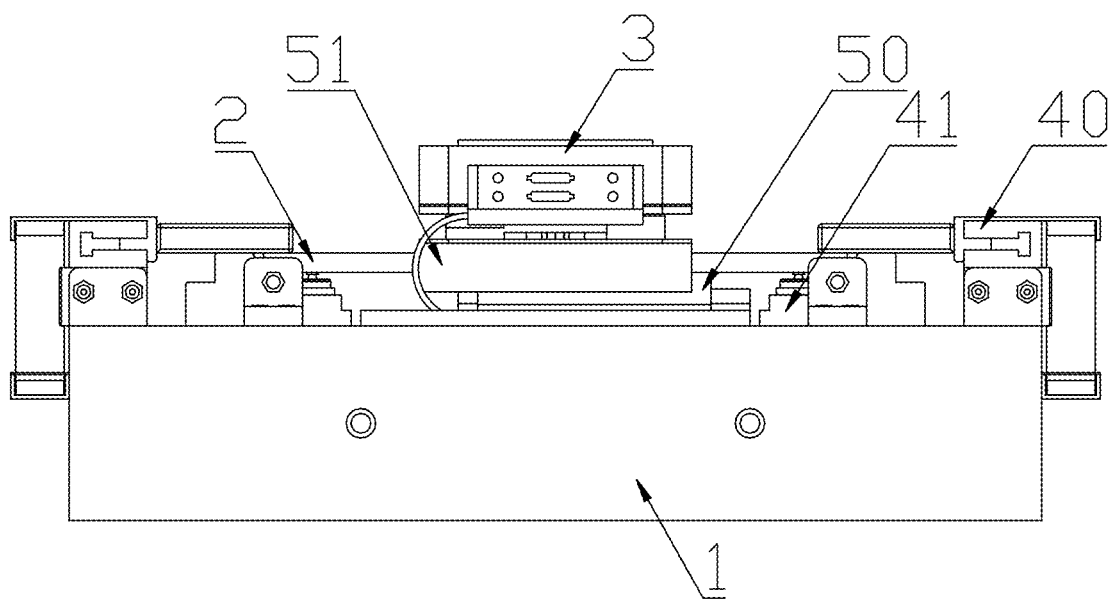
FIG. 2 is a forward schematic diagram for connecting the base platform and the floating platform.
Figure 3:
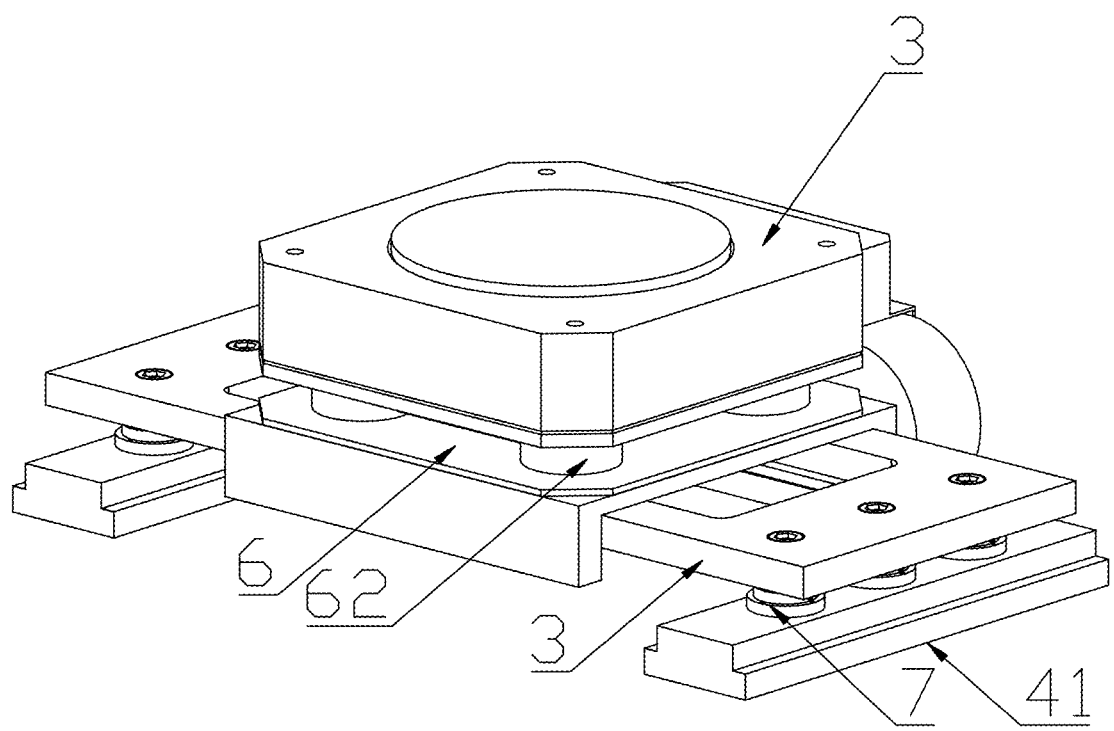
FIG. 3 is a schematic diagram for connecting a damping assembly and a micromotion platform.

With reference to FIG. 1-FIG. 3, a six-degree-of-freedom air-floating moving apparatus comprises a base platform 1, wherein a floating platform 2 is provided above the base platform 1, a micromotion platform 3 is provided above the floating platform 2, the base platform 1 is provided with an X-axis moving assembly 4, the floating platform 2 is provided with a Y-axis moving assembly 5, the X-axis moving assembly 4 can drive the floating platform 2 to move, the Y-axis moving assembly 5 can drive the micromotion platform 3 to move, a damping assembly 6 is connected to a bottom of the micromotion platform 3, and the damping assembly 6 is used for stabilizing the micromotion platform 3.

The micromotion platform 3 has four degrees of freedom, and the micromotion platform 3 can rotate in an X-axis direction, a Y-axis direction and a Z-axis direction, respectively, and lift up and down in the Z-axis direction, to achieve focusing and leveling.

The floating platform 2 is controlled by the X-axis moving assembly 4 provided on the base platform 1, so that the floating platform 2 moves linearly on an X-axis with respect to the base platform 1, and the micromotion platform 3 is controlled by the Y-axis moving assembly 5 connected with the floating platform 2, so that the micromotion platform 3 moves linearly in the Y-axis direction with respect to the floating platform 2. The micromotion platform 3 itself can achieve axial rotation in the X-axis or Y-axis direction, to adjust an angle position, and the micromotion platform 3 itself has a liftable and lowerable rotation platform, to achieve lifting up and down and axial rotation in the Z-axis direction and match the X-axis moving assembly 4 and the Y-axis moving assembly 5 to achieve six-degree-of-freedom motion. The overall structure is compact, and the occupied space is small.

The X-axis moving assembly 4 comprises an X-axis linear motor 40 and an X-axis bearing platform 41, the X-axis linear motor 40 is connected to each of two sides of the floating platform 2, the X-axis bearing platform 41 is provided at each of two sides below the floating platform 2, an air bearing 7 is provided at a bottom of the floating platform 2, and the air bearing 7 is matched with the X-axis bearing platform 41.

The X-axis linear motor 40 is used for controlling and driving the floating platform 2 to move, and the air bearing 7 can form an air film at an upper end of the X-axis bearing platform 41 after ventilation to form an air-floating support at the bottom of the floating platform 2.

The Y-axis moving assembly 5 comprises a Y-axis linear motor 50 and a sliding platform 51, the Y-axis linear motor 50 is fixed below the floating platform 2, the sliding platform 51 is provided on the floating platform 2 and connected with the Y-axis linear motor 50, and the micromotion platform 3 is provided above the sliding platform 51 through the damping assembly 60.

Figure 4:
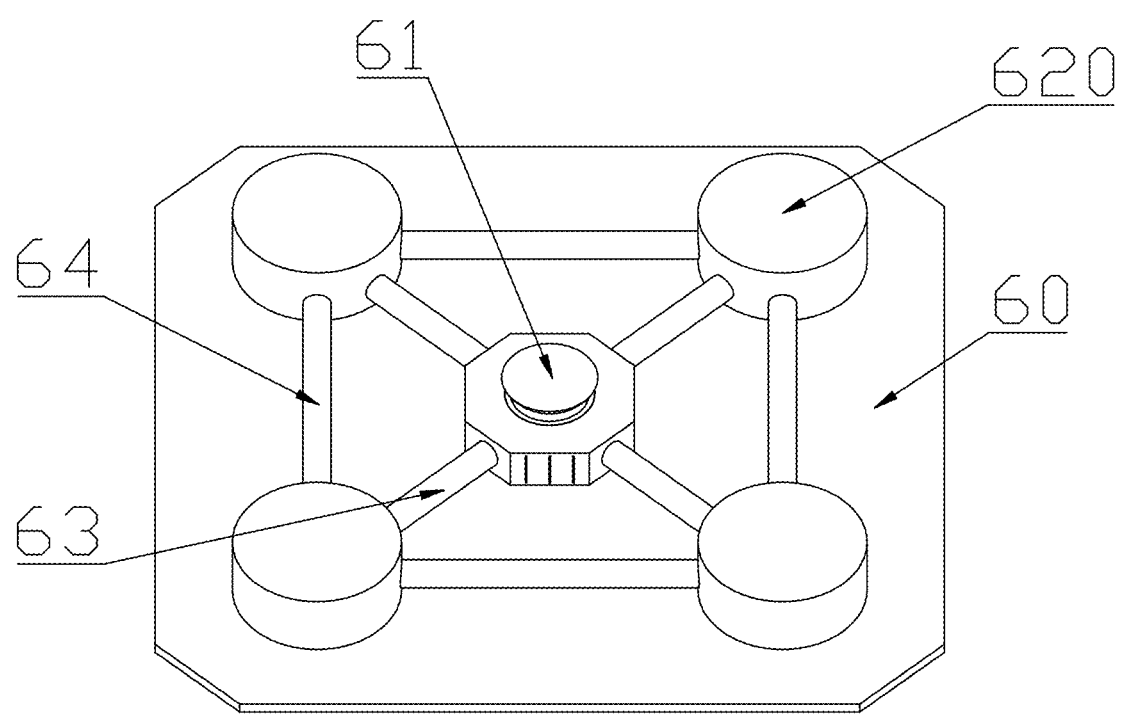
FIG. 4 is a structural schematic diagram of the damping assembly.
Figure 5:
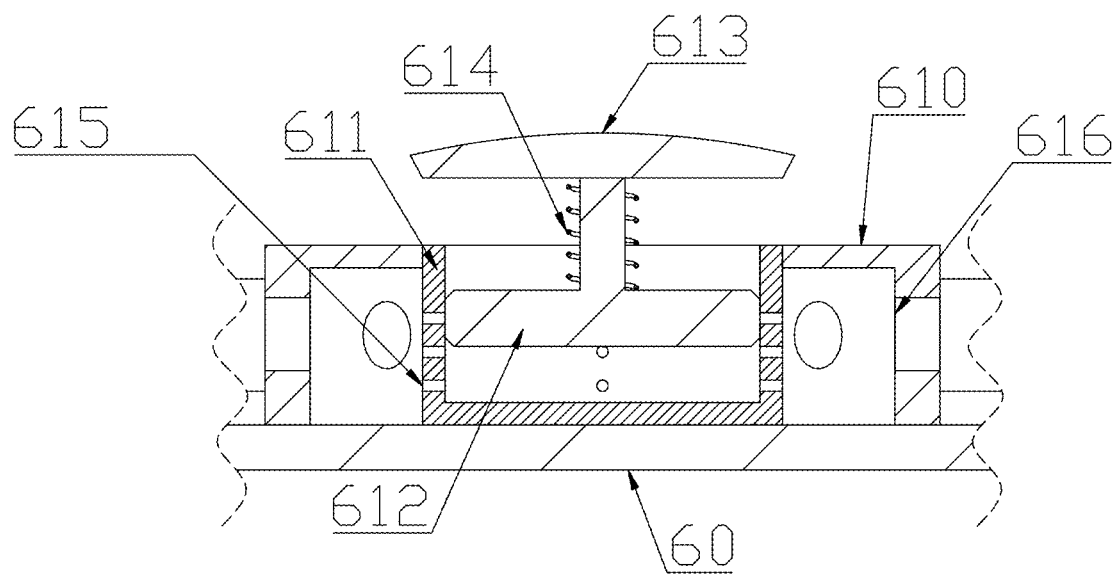
FIG. 5 is a section view of a first damping member.

With reference to FIG. 4-FIG. 5, the damping assembly 6 comprises a bottom plate 60 fixed at an upper end of the sliding platform 51, a first damping member 61 supporting the micromotion platform 3 is provided in the center of the bottom plate 60, a plurality of second damping members 62 around the first damping member 61 are provided on the bottom plate 60, a first connection pipe 63 is provided between the first damping member 61 and any of the second damping members 62, and a second connection pipe 64 is provided between the adjacent second damping members 62.

The first damping member 61 in the center of the bottom plate 60 provides central support for the micromotion platform 3, the micromotion platform 3 shakes in a motion process or at the moment when the motion stops, the shaking is transferred to the first damping member 61 below, and the first damping member 61 disperses the interference generated by the shaking to the plurality of second damping members 62 dispersed annularly through the first connection pipe 63, which reduces vibration interference in the internal center of the micromotion platform 3. On one hand, the motion precision is improved, and the interference during slipping motion caused by an assembly deviation due to the vibration is prevented. On the other hand, it is beneficial for protecting an internal structure of the micromotion platform 3 and reducing the maintenance cost.

The first damping member 61 comprises a base 610 fixed to the bottom plate 60, a sleeve 611 is fixed in the base 610, a piston 612 is slidably connected in the sleeve 611, a rubber joint 613 is connected to an upper part of the piston 612, the rubber joint 613 supports the bottom of the micromotion platform 3, a cylindrical spring 614 is connected between the rubber joint 613 and the piston 612, a plurality of air holes 615 are provided in a side wall of the sleeve 611, a plurality of vertical joints 616 are provided on a side wall of the base 610, and the vertical joint 616 can release a gas from inside to outside under the premise of sufficient air pressure.

The micromotion platform 3 presses the rubber joint 613 while shaking, the rubber joint 613 drives the piston 612 connected below to lift up and down with respect to the sleeve 611, the cylindrical spring 614 resets after compressed deformation, the piston 612 moves down in the sleeve 611 and squeezes an internal gas, and the gas can be slowly discharged from the air holes 615 annularly arranged in the side wall of the sleeve 611 into the base 610 and then slowly discharged from the vertical joints 616 to the outside, to buffer jumping of the micromotion platform 3 in the Z-axis direction, thereby further improving the precision. The operation space of the micromotion platform 3 is usually a dustfree environment, but the possibility of impurities and debris on a surface of the floating platform 2 is not excluded. The airflow discharged from the plurality of air holes 615 can flow upward from the base 610. On one hand, the flow of the airflow around the bottom of the micromotion platform 3 is facilitated, which is beneficial for cleaning the impurities on the floating platform 2 and achieving self-cleaning. On the other hand, the flowing airflow can cool the micromotion platform 3 upwards, to optimize a working environment of the micromotion platform 3 and increase the service life. The sleeve 611 and the piston 612 are provided to form an interval between the micromotion platform 3 and the floating platform 2, to prevent the air film formed by the air bearing 7 from affecting the stability of parts above the micromotion platform 3.

The bottom plate 60 is a square plate, the second damping member 62 comprises a cylindrical air bag 620, a plurality of the cylindrical air bags 620 are located at four corners of the bottom plate 60, respectively, the cylindrical air bag 620 is communicated with an interior of the base 610 through the first connection pipe 63, and the adjacent cylindrical air bags 620 are communicated through the second connection pipe 64.

A part of the airflow discharged from the air holes 615 of the sleeve 611 can pass through the first connection pipe 63 to enter each cylindrical air bag 620, and the air bag 620 is inflated to form a support for four corners of the micromotion platform 3, to ensure parallelism between the micromotion platform 3 and the floating platform 2 and prevent reduced precision caused by tilted installation of the parts on the micromotion platform 3. In addition, when the working intensity of the micromotion platform 3 is too high, which causes an excessively higher local temperature, heat is transferred to the cylindrical air bag 620, so that its internal gas absorbs the heat and expands, and the adjacent cylindrical air bags 620 disperse the heated gas through the second connection pipe 64, to prevent faults caused by local overheating of the micromotion platform 3. In addition, since the cylindrical air bag 620 is limited by the micromotion platform 3 above and the bottom plate 60 below, a degree of expansion of the cylindrical air bag 620 is limited, so that the gas acts to the base 610 and is discharged from the sleeve 611, to achieve heat dissipation.

Figure 6:
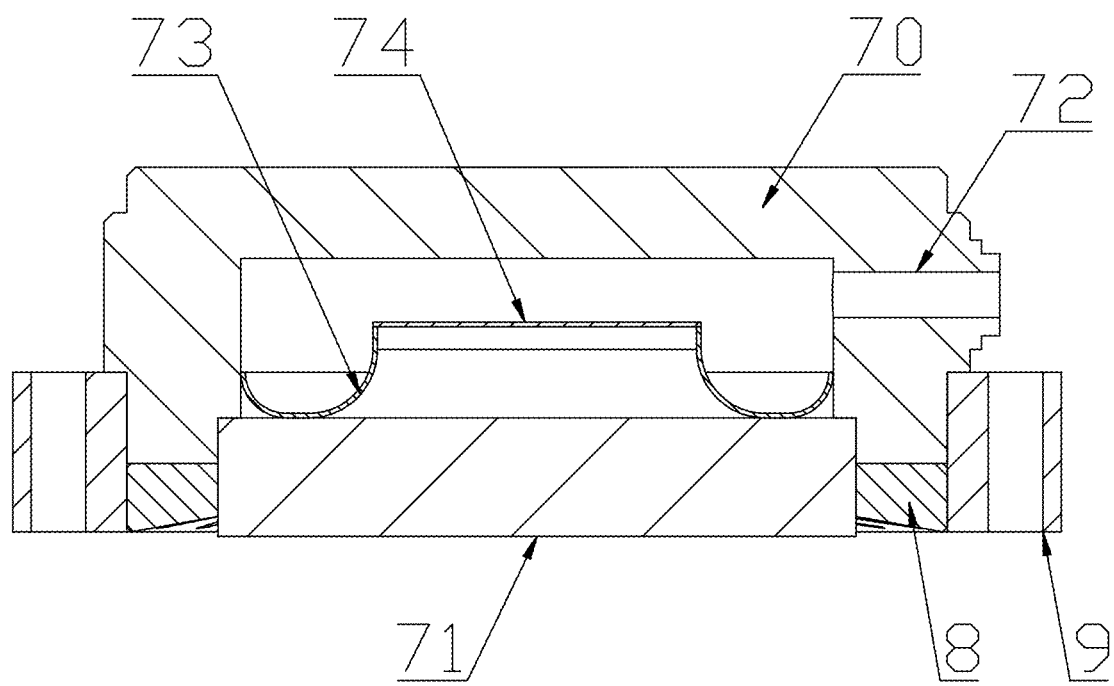
FIG. 6 is a schematic diagram of an internal structure of an air bearing.
Figure 7:
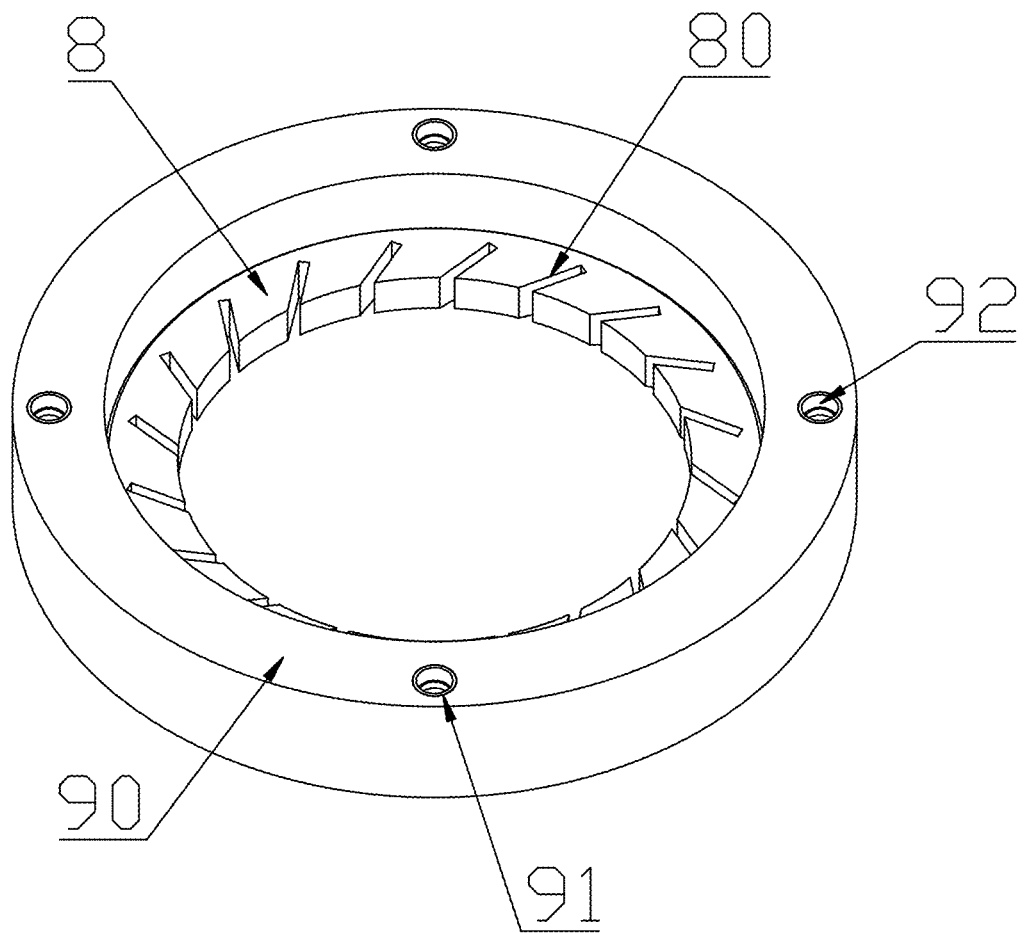
FIG. 7 is a schematic diagram of a guide ring.

With reference to FIG. 6-FIG. 7, the air bearing 7 comprises a matrix 70, a cylindrical groove is located at a bottom of the matrix 70, a porous plate 71 is provided in the cylindrical groove, a cavity is formed between an inner wall of the cylindrical groove and an outer wall of the porous plate 71, the cavity is communicated with an air vent 72, a flow rectifier plate 73 is provided in the cavity, the flow rectifier plate 73 has a U-shaped cross section and an upward opening, and a filter mesh 74 is provided in the center of the flow rectifier plate 73.

It shall be noted that the filter mesh 74 uses an air filter mesh 74 with filtration precision of 0.2 microns-50 microns, and a material of the filter mesh 74 is polypropylene with heat resistance and chemical resistance.

The gas entering the air vent 72 is subjected to primary filtration by external filtration equipment and then enters the cavity. In order to ensure that the gas passing through the porous plate 71 does not contain fine particles or water, the filter mesh 74 with higher entrapment precision than that of the external filtration equipment is provided to perform secondary filtration on the gas, to prevent impurities and particulate matters in the gas from blocking the porous plate 71 and ensure the stability of forming the air film by the porous plate 71. The other part of the airflow is guided by an arc-shaped curved surface after being in contact with the flow rectifier plate 73, the impurities and particulate matters filtered on the filter mesh 74 can be guided, and the particulate matters are facilitated to fall into a concave space of the flow rectifier plate 73. On one hand, the particulate matters are collected; on the other hand, the particulate matters are avoided to continuously stay on the filter mesh 74 to cause the inability of subsequent gases to pass smoothly, resulting in the instability of forming the air film by the porous plate 71.

A guide ring 8 is provided at the bottom of the matrix 70, the guide ring 8 is sheathed outside the porous plate 71, a bottom end surface of the guide ring 8 is lower than a bottom end surface of the porous plate 71, a guide groove 80 is provided inside the guide ring 8, the guide groove 80 is an arc-shaped groove, and a plurality of the guide grooves 80 are arranged annularly. Without ventilation or in case of unstable airflow output, the bottom end surface of the guide ring 8 is in contact with the X-axis bearing platform 41, to reduce the abrasion possibility of the porous plate 71, ensure stable output of the air film and increase the service life to reduce the maintenance cost. The guide ring 8 guides the gas discharged from the porous plate 71 to flow around quickly through the guide groove 80 inside the guide ring 8, to form spiral airflow, which can prevent the airflow from gathering in front of the porous plate 71 to cause gas block-up, and is beneficial for preventing unsmooth air-exhaust from causing an offset of the floating platform 2.

Figure 8:
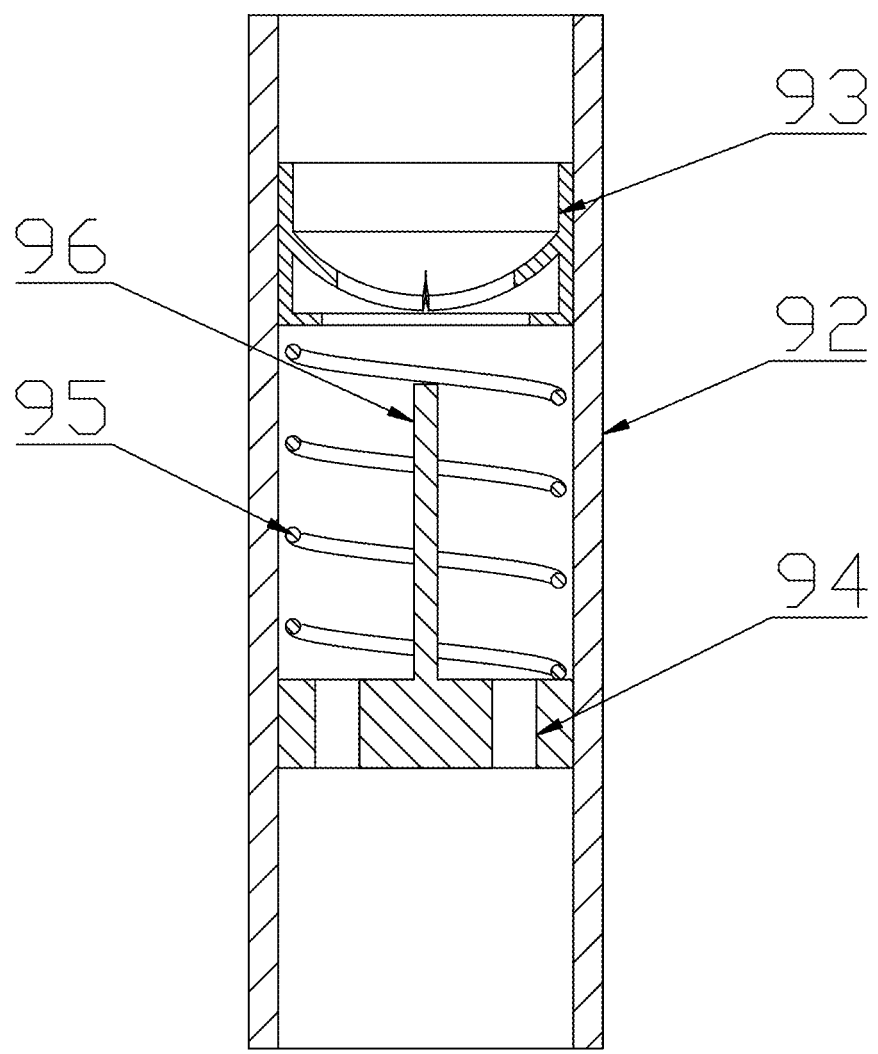
FIG. 8 is a schematic diagram of an internal structure of a pipe sleeve.

With reference to FIG. 7-FIG. 8, an auxiliary assembly 9 is provided outside a bottom of the air bearing 7, the auxiliary assembly 9 comprises a guard ring 90, the guard ring 90 is located outside the guide ring 8 and connected with the matrix 70, the guard ring 90 is provided with a plurality of troughs 91 penetrating longitudinally, the plurality of troughs 91 are provided around the center of the guard ring 90, a pipe sleeve 92 is provided in the trough 91, a silicon valve 93 is slidably provided in the pipe sleeve 92, the silicon valve 93 is in a hemispherical shape and has an upward concave surface, a support ring 94 is fixed in the pipe sleeve 92, the support ring 94 is located below the silicon valve 93 and a reset spring 95 is connected between the support ring 94 and the silicon valve 93, a guide column 96 is fixed in the middle of the support ring 94, the silicon valve 93 has a cross-shaped opening, the guide column 96 can pass through the cross-shaped opening, and the trough 91 and the air vent 72 are communicated to a same air pump.

The air pump works to output a gas, and the gas enters the cavity in the air bearing 7 and the pipe sleeve 92, respectively. When an air pressure entering the pipe sleeve 92 is within an appropriate range, the silicon valve 93 will not be deformed; at this time, the cross-shaped opening is closed, and a subsequent gas continues to flow out from the porous plate 71 of the air bearing 7, to form a uniform air film. When the air pressure of the gas output by the air pump is excessive, the air pressure entering the pipe sleeve 92 and acting on the silicon valve 93 is increased, to push the silicon valve 93 to get close to the support ring 94 and squeeze the reset spring 95. At this time, the cross-shaped opening passes through the guide column 96 and is opened to form upper and lower communication of the silicon valve 93, so that the excessive air pressure flows out from the bottom of the pipe sleeve 92, to reduce the intensity of the air pressure at the porous plate 71 and ensure output stability of the air film. Meanwhile, the airflow flowing out from the bottom of the pipe sleeve 92 flows out from an outer edge of the porous plate 71, to sweep up the X-axis bearing platform 41 without affecting the air film. When the air pressure of the gas returns to normal, the air pressure above the silicon valve 93 is reduced to lose a downward pressure, so that the reset spring 95 restores deformation, and the cross-shaped opening of the silicon valve 93 leaves the guide column 96 and is closed, to ensure normal output of the airflow from the porous plate 71 to form the air film.

For those skilled in the art, it is obvious that the present disclosure is not limited to details of the above exemplary embodiments, and that the present disclosure can be implemented in other specific forms without departing from the spirit or essential features of the present disclosure. Therefore, the embodiments shall be regarded as exemplary and non-restrictive in any way, and the scope of the present disclosure is limited by the appended claims instead of the above description, so that it is intended to include all changes that fall within the meaning and scope of equivalent elements of the claims in the present disclosure. Any drawing mark in the claims shall not be deemed as a limitation to the claims involved.

What is claimed is:

1. A six-degree-of-freedom air-floating moving apparatus, comprising a base platform (1), wherein a floating platform (2) is provided above the base platform (1), a micromotion platform (3) is provided above the floating platform (2), the base platform (1) is provided with an X-axis moving assembly (4), the floating platform (2) is provided with a Y-axis moving assembly (5), the X-axis moving assembly (4) is capable of driving the floating platform (2) to move, the Y-axis moving assembly (5) is capable of driving the micromotion platform (3) to move, and a damping assembly (6) is connected to a bottom of the micromotion platform (3);

the Y-axis moving assembly (5) comprises a Y-axis linear motor (50) and a sliding platform (51), the Y-axis linear motor (50) is fixed below the floating platform (2), the sliding platform (51) is provided on the floating platform (2) and connected with the Y-axis linear motor (50), and the micromotion platform (3) is provided above the sliding platform (51) through the damping assembly (6);

the damping assembly (6) comprises a bottom plate (60) fixed at an upper end of the sliding platform (51), a first damping member (61) supporting the micromotion platform (3) is provided in the center of the bottom plate (60), a plurality of second damping members (62) around the first damping member (61) are provided on the bottom plate (60), a first connection pipe (63) is provided between the first damping member (61) and any of the second damping members (62), and a second connection pipe (64) is provided between the adjacent second damping members (62);

the first damping member (61) comprises a base (610) fixed to the bottom plate (60), a sleeve (611) is fixed in the base (610), a piston (612) is slidably connected in the sleeve (611), a rubber joint (613) is connected to an upper part of the piston (612), the rubber joint (613) supports the bottom of the micromotion platform (3), a cylindrical spring (614) is connected between the rubber joint (613) and the piston (612), a plurality of air holes (615) are provided in a side wall of the sleeve (611), and a plurality of vertical joints (616) are provided on a side wall of the base (610); and the bottom plate (60) is a square plate, the second damping member (62) comprises a cylindrical air bag (620), a plurality of the cylindrical air bags (620) are located at four corners of the bottom plate (60), respectively, the cylindrical air bag (620) is communicated with an interior of the base (610) through the first connection pipe (63), and the adjacent cylindrical air bags (620) are communicated through the second connection pipe (64).

2. The six-degree-of-freedom air-floating moving apparatus according to claim 1, wherein the X-axis moving assembly (4) comprises an X-axis linear motor (40) and an X-axis bearing platform (41), the X-axis linear motor (40) is connected to each of two sides of the floating platform (2), the X-axis bearing platform (41) is provided at each of two sides below the floating platform (2), an air bearing (7) is provided at a bottom of the floating platform (2), and the air bearing (7) is matched with the X-axis bearing platform (41).

3. The six-degree-of-freedom air-floating moving apparatus according to claim 2, wherein the air bearing (7)

comprises a matrix (70), a cylindrical groove is located at a bottom of the matrix (70), a porous plate (71) is provided in the cylindrical groove, a cavity is formed between an inner wall of the cylindrical groove and an outer wall of the porous plate (71), the cavity is communicated with an air vent (72), a flow rectifier plate (73) is provided in the cavity, the flow rectifier plate (73) has a U-shaped cross section and an upward opening, and a filter mesh (74) is provided in the center of the flow rectifier plate (73).

4. The six-degree-of-freedom air-floating moving apparatus according to claim 3, wherein a guide ring (8) is provided at the bottom of the matrix (70), the guide ring (8) is sheathed outside the porous plate (71), a guide groove (80) is provided in an inner side of the guide ring (8), the guide groove (80) is an arc-shaped groove, and a plurality of the guide grooves (80) are arranged annularly.

\* \* \* \* \*